United States Patent
Keller et al.

(10) Patent No.: US 7,147,051 B2
(45) Date of Patent: Dec. 12, 2006

(54) COOLING ELEMENT

(75) Inventors: Markus Keller, Zürich (CH);
Marianne Pleines, Winterthur (CH);
Jochen Kiefer, Nussbaumen (CH);
Thomas Schoenemann, Lengnau (CH);
Mercedes Dominguez Calvo, Madrid (ES)

(73) Assignee: ABB Schweiz AG, Baden (CH)

( * ) Notice: Subject to any disclaimer, the term of this patent is extended or adjusted under 35 U.S.C. 154(b) by 155 days.

(21) Appl. No.: 10/435,026

(22) Filed: May 12, 2003

(65) Prior Publication Data
US 2003/0213586 A1 Nov. 20, 2003

(30) Foreign Application Priority Data
May 16, 2002 (EP) .................... 02405396

(51) Int. Cl.
*H05K 7/20* (2006.01)
(52) U.S. Cl. ..................... 165/185; 361/713
(58) Field of Classification Search ............. 165/185; 361/713
See application file for complete search history.

(56) References Cited
U.S. PATENT DOCUMENTS

| | | | | |
|---|---|---|---|---|
| 2,965,819 A | * | 12/1960 | Rosenbaum | ............ 165/185 |
| 3,261,396 A | * | 7/1966 | Trunk | ............ 165/185 |
| 4,471,837 A | * | 9/1984 | Larson | ............ 165/185 |
| 4,587,377 A | | 5/1986 | Rodseth | |
| 4,675,784 A | * | 6/1987 | Dahlberg et al. | ............ 361/706 |
| 4,849,856 A | * | 7/1989 | Funari et al. | ............ 165/185 |
| 6,068,051 A | * | 5/2000 | Wendt | ............ 165/185 |
| 6,147,867 A | | 11/2000 | Gaudrel et al. | |
| 6,165,612 A | | 12/2000 | Misra | |
| 6,255,719 B1 | | 7/2001 | Kuriyama et al. | |

FOREIGN PATENT DOCUMENTS

| | | |
|---|---|---|
| DE | 3629976 A1 | 4/1988 |
| DE | 19619060 A1 | 11/1997 |
| DE | 19727912 C1 | 10/1998 |
| DE | 19811000 C1 | 8/1999 |

\* cited by examiner

*Primary Examiner*—Leonard R. Leo
(74) *Attorney, Agent, or Firm*—Buchanan Ingersoll & Rooney PC

(57) ABSTRACT

The basis taken is a cooling element (1) made of a metal or of a metal alloy having at least one cooling rib (4) which is connected to a metal housing (11) for an operating means. The intention is to provide a cooling element (1) which has an improved cooling capacity. The inventive cooling element (1) is detachably connected to the housing (11) by means of fixing means. The cooling element (1) is provided with a thermally conductive and electrically insulating coating (2), and it has the same electrical potential as the housing (11), but carries no current.

7 Claims, 1 Drawing Sheet

COOLING ELEMENT

This application claims priority under 35 U.S.C. §§ 119 and/or 365 to 02405396.9 filed in Europe on May 16, 2002; the entire content of which is hereby incorporated by reference.

FIELD OF THE INVENTION

The invention is based on a cooling element for dissipating heat.

BACKGROUND OF THE INVENTION

It is known practice to improve the dissipation of heat from electrical operating means using cooling ribs. Generally, the cooling ribs are integrally molded onto the metal housing of the operating means in question, for example switchgear, in order to achieve good transfer of heat in this manner. This improved dissipation of heat allows either higher current loading for the operating means or allows a saving on electrically conductive material. A drawback of these cooling ribs molded on directly is that some of the on electric current flowing through the operating means also flows through the cooling ribs as a result of current displacement effects and additionally heats them. To dissipate this additional heating, a certain proportion of the cooling capacity of the cooling rib is needed. Accordingly, to provide this additionally required cooling capacity, the cooling ribs need to be given larger dimensions. The result of these enlarged cooling ribs is that the dimensions of the operating means are increased at the same time, and hence this operating means is made more expensive.

SUMMARY OF THE INVENTION

The invention, as characterized in the independent claim, achieves the object of providing a cooling element which has an improved cooling capacity.

This is achieved by virtue of the cooling element logically not being used as a current conductor. The cooling element can therefore be optimally designed for a particularly good cooling capacity. The cooling element is made of a metal or of a metal alloy. It has at least one cooling rib or any other raised structure which enlarges the surface of the cooling element. The cooling element is detachably connected to a metal housing for an operating means by means of fixing means or using the matching shapes. The cooling element is provided with a thermally conductive and electrically insulating coating and has the same electrical potential as the housing.

The highly thermally conductive coating is made predominantly of a boron nitride or aluminum nitride powder or of a mixture of the two powders. If the cooling element is made of an aluminum alloy, then it is advantageously provided with an anodized oxide layer as a coating. In this cooling element, the current path through the housing and the channel for dissipating the heat are completely isolated from one another, despite the internal contact between the housing and the cooling element.

It is entirely conceivable for organic materials also to be used for the electrically insulating and highly thermally conductive coating, which is then applied in the form of a lacquer, for example, by means of spraying or dipping.

If the operating means is subjected to forced cooling, for example using blow-out, then the cooling element is designed to promote flow and is in a form such that the flow of coolant covers the largest possible surface, so that the most effective dissipation of heat possible is ensured.

The invention, its development and the advantages which can be achieved therewith are explained in more detail below with reference to the drawing, which illustrates just one possible manner of implementation.

BRIEF DESCRIPTION OF THE DRAWINGS

In the drawing:

FIG. 1b shows a section A—A through the cooling element from FIG. 1a, and

In the figures, identical elements are provided with the same reference symbols. Any elements which are not needed for the direct understanding of the invention have not been shown and are not described.

DETAILED DESCRIPTION OF THE INVENTION

Figure 1A:
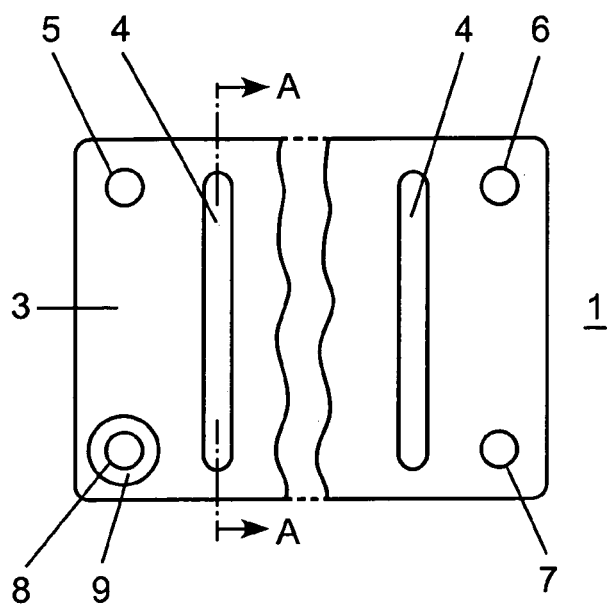
FIG. 1a shows a plan view of a cooling element shown in simplified form.
Figure 1B:
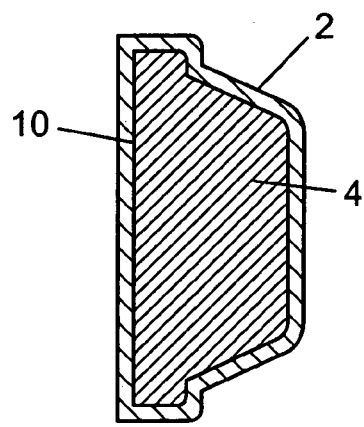

FIG. 1a shows a plan view of a cooling element 1 shown in simplified form. FIG. 1b shows a section A—A through the cooling element shown in FIG. 1a. The cooling element 1 is made of a highly thermally conductive metal, for example of an aluminum casting. The entire surface of the cooling element 1 is provided with an electrically insulating, highly thermally conductive coating 2. The coating 2 can be made, by way of example, predominantly of boron nitride or aluminum nitride powder which is applied, together with bonding agents, to the entire surface of the cooling element 1. Alternatively, the coating 2 can be made of a mixture of the two powders. In the case of a cooling element 1 made of aluminum casting, the surface is advantageously coated with an anodized oxide layer. This anodized oxide layer preferably has a layer thickness of between 15 and 20 mm; an area of between 10 and 50 mm can have good to very good electrically insulating properties and can at the same time afford good thermal conductivity.

The cooling element 1 has a baseplate 3 on which at least one cooling rib 4 is integrally molded. The baseplate 3 has holes 5, 6, 7 and 8 which are provided for screwing (not shown) the cooling element 1 to the operating means which is to be cooled. The hole 8 has a bearing face 9 which surrounds this hole 8. On this bearing face 9, the coating 2 has been completely removed, and it is bare metal. If the cooling element 1 is made of aluminum casting, it may be appropriate to grease this bearing face 9 in order to avoid oxidation. Only one of the holes 5, 6, 7 and 8 is ever provided with this bare metal bearing face 9. That side of the baseplate 3 which faces the operating means has a planar base 10. This base 10 is likewise covered entirely with the respective coating 2.

Figure 2:
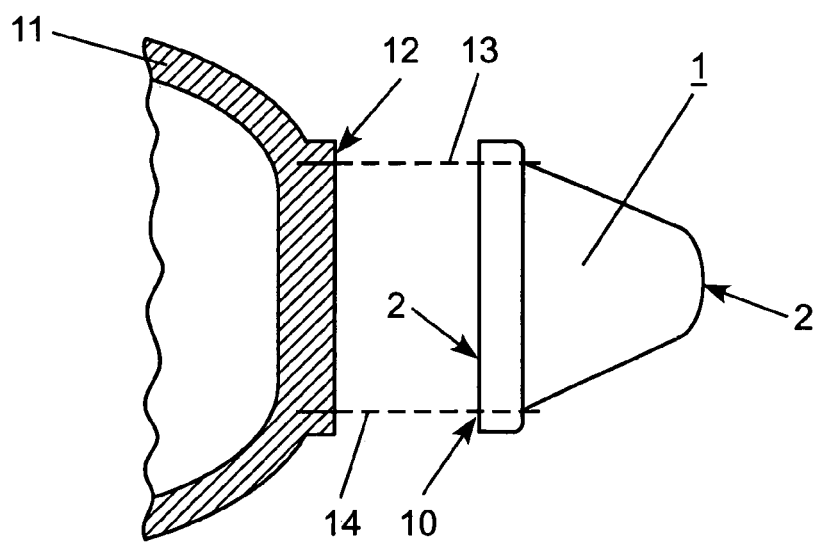
FIG. 2 shows a partial section through a housing having an integrally molded face, and the cooling element provided for mounting on this face.

FIG. 2 shows a partial section through a metal, current-carrying housing 11 for an operating means having an integrally molded mounting face 12. This mounting face 12 is in the form of bare metal. This mounting face 12 has the cooling element 1 screwed to it. Two dashed lines 13 and 14 indicate this screw connection for the cooling element 1. The surface of the mounting face 12 is matched to the shape of the surface of the base 10 of the cooling element 1. Preferably, planar surface shapes are chosen; it is entirely possible, however, for cylindrical faces or other spherical surface shapes to be provided, for example. In addition, by way of example, the cooling element 1 can be inserted into a groove which is formed in the surface of the operating means and then holds the cooling element 1 using the matching shapes. In addition, the contact between the groove sides and the cooling element 1 could in this case be strengthened by means of spring force, which would result in better transfer of heat.

Generally, the housing 11 of the operating means is provided with a multiplicity of mounting faces 12; however, only as many cooling elements 1 as are needed for the respectively provided current loading are mounted on these mounting faces 12. Accordingly, the operating means can be optimally matched to its thermal loading. If there are still free mounting faces 12 on an operating means, then it can subsequently be strengthened for higher current loading with little complexity for mounting. Another particular advantage is found to be that free mounting faces 12 permit improved dissipation of heat to be achieved subsequently, should this prove necessary during operation. This allows the operational reliability of the installation to be improved. It is also possible to increase the operating means' current-carrying capacity by virtue of the originally fitted cooling elements 1 being replaced with new cooling elements 1 which can provide a greater cooling action because they have a larger cooling surface or a larger number of cooling ribs, for example.

To explain the action, the figures are considered in a little more detail. In this case, the housing 11 is made of an aluminum casting, for example, and is generally anodized. During anodic treatment, the mounting face 12 is covered, however, so that it remains bare metal, and any oxidation films are removed before the cooling element 1 is mounted. During screwing (other fixing options are also conceivable), the entire base 10 of the cooling element 1 is pressed against this mounting face 12 with a comparatively large amount of force, so that internal touching contact is produced between these two faces 10 and 12, which allows good transfer of heat from the housing 11 to the cooling element 1. The base 10 is coated so as to be electrically insulating, which means that no electric current can flow from the housing 11 through the cooling element 1, despite the internal touching contact.

However, the cooling element 1 is made of metal, which could carry undefined electric charges in the case of zero-potential fixing. To prevent this, the cooling element 1 is connected to the potential of the housing 11 using the metal screw which passes through the hole 8 and whose head rests on the bare metal bearing face 9. Since only one of the screw locations ever has such a bearing face 9, it is certain that no electric current can flow through the cooling element 1 via the metal screws. With this form of the cooling element 1, the current path through the housing 11 and the channel for dissipating the heat are completely isolated from one another, despite the internal contact between the housing 11 and the cooling element 1. In principle, it would also be possible to dispense with this one screw location produced for potential connection and to replace it with a spot weld. The potential connection would likewise be made certain in this manner.

LIST OF REFERENCES

1 Cooling element
2 Coating
3 Baseplate
4 Cooling rib
5,6,7,8 Holes
9 Bearing face
10 Base
11 Housing
12 Mounting face
13,14 Dashed lines

The invention claimed is:

1. A cooling element made of a metal or a metal alloy having at least one cooling rib the cooling element constructed for connection to a metal housing for an operating means which is to be cooled, the cooling element comprising:
   a thermally conductive and electrically insulating coating that electrically isolates the cooling element from the housing; and
   a plurality of holes wherein only one of the holes is configured for an electrical potential connection with the housing.

2. The cooling element as claimed in claim 1, wherein the cooling element is made of an aluminum alloy and is provided with an anodized oxide layer as a coating.

3. The cooling element as claimed in claim 2, wherein the layer thickness of the anodized oxide layer is in the range from 10 to 50 µm.

4. The cooling element as claimed in claim 3, wherein the layer thickness of the anodized oxide layer is in the range from 15 to 20 µm.

5. The cooling element as claimed in claim 1, wherein the cooling element is detachably connected to the housing by means of fixing means.

6. The cooling element as claimed in claim 1, wherein the metal housing for the operating means has at least one mounting face which is matched to a coated base of the cooling element,
   in that the mounting face is in the form of bare metal, and
   in that the entire base of the cooling element is pressed against this mounting face, so that internal touching contact is produced between the two.

7. The cooling element as claimed in claim 1, wherein a metallic screw is inserted into the only one of the holes to provide the electrical potential connection.

* * * * *